(12) United States Patent
Okamura et al.

(10) Patent No.: US 7,880,521 B2
(45) Date of Patent: Feb. 1, 2011

(54) DIFFERENTIAL DRIVER AND METHOD CAPABLE OF CONTROLLING SLEW RATE

(75) Inventors: Hitoshi Okamura, Seongnam-si (KR); Byung-Hyun Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 256 days.

(21) Appl. No.: 11/882,567

(22) Filed: Aug. 2, 2007

(65) Prior Publication Data

US 2008/0030241 A1 Feb. 7, 2008

(30) Foreign Application Priority Data

Aug. 3, 2006 (KR) .................... 10-2006-0073456

(51) Int. Cl.
*H03K 5/12* (2006.01)
(52) U.S. Cl. .................... 327/170; 327/108; 327/274
(58) Field of Classification Search ......... 327/108–112, 327/170, 269, 274; 326/82, 83
See application file for complete search history.

(56) References Cited

U.S. PATENT DOCUMENTS

| | | | |
|---|---|---|---|
| 5,801,563 A | 9/1998 | McClure | |
| 6,281,730 B1 | 8/2001 | Vu | |
| 7,135,903 B2 * | 11/2006 | Kizer et al. | 327/159 |
| 7,436,340 B2 * | 10/2008 | Sasaki | 341/144 |
| 7,486,112 B2 * | 2/2009 | Tanaka | 327/108 |
| 2003/0154045 A1 * | 8/2003 | Sung et al. | 702/107 |
| 2004/0113656 A1 * | 6/2004 | Sato | 326/86 |
| 2005/0280460 A1 * | 12/2005 | Gregory | 327/218 |
| 2007/0052455 A1 * | 3/2007 | Sung et al. | 327/108 |

FOREIGN PATENT DOCUMENTS

| | | |
|---|---|---|
| EP | 0 632 591 | 1/1995 |
| KR | 10-2006-0005800 | 1/2006 |

* cited by examiner

*Primary Examiner*—Long Nguyen
(74) *Attorney, Agent, or Firm*—Lee & Morse, P.C.

(57) ABSTRACT

A differential driver includes first and second pull-up resistors respectively connected to first and second output terminals, a plurality of differential-input transistor pairs connected each to the first and second output terminals, current sources connected each to the differential-input transistor pairs, and a slew rate controller adapted to generate differential input signals to be applied each to the differential-input transistor pairs in response to an input signal. The slew rate controller may output the differential input signals simultaneously or sequentially.

17 Claims, 4 Drawing Sheets

DIFFERENTIAL DRIVER AND METHOD CAPABLE OF CONTROLLING SLEW RATE

BACKGROUND OF THE INVENTION

1. Field of the Invention

Embodiments relate to differential drivers and methods. More particularly, embodiments relate to a differential driver and method able to adjust a slew rate of an output signal independent of variations in a process voltage temperature (PVT) and of a maximum operating frequency.

2. Description of the Related Art

FIG. 1 illustrates a circuit diagram of a general differential driver 100. The general differential driver 100 shown in FIG. 1 may include a mirrored structure coupled thereto. Thus, the fan-out is two, but FIG. 1 illustrates just the left-side differential amplifier 100 for ease of explanation.

Referring to FIG. 1, the differential driver 100 may include a main drive circuit 101, a slew rate controller 102, a terminal resistor (or pull-up resistor) Rt, and a current source Cs. The main driver 101 may include three NMOS transistors (hereinafter, 'transistors') M4, M5, and M6, which may be turned on or off in response to a voltage level of an input signal IN. Since the differential driver 100 includes only a single current source CS, the transistors M4~M6 may have a same gate width. The slew rate controller 102 may include two resistors R1 and R2 to vary operation speed between the transistors M4~M6, a transmission gate TG11 turned on or off by control nodes C1 and C1b, and a transmission gate TG12 turned on or off by control nodes C2 and C2b.

FIG. 2 illustrates a graph showing slew rates of an output signal generated by the differential driver 100 of FIG. 1.

Referring to FIGS. 1 and 2, in the differential driver 100, the transistors M4~M6 may be simultaneously turned on when the input signal IN is high and the transmission gates TG11 and TG12 are all turned on by the control nodes C1, C1b, C2, and C2b. If the transistors M4~M6 are simultaneously turned on, an unexpectedly large amount of current may flow through the differential driver 100, raising a slew rate of the output signal OUT. A resultant waveform 10, shown in FIG. 2, has a large slope, thus a slew rate of the output signal OUT from the differential driver 100 is high. As the slew rate of the output signal OUT increases, an effect of electromagnetic interference (EMI) increases, thereby increasing noise of the output signal OUT.

When the input signal IN is high and the transmission gates TG11 and TG12 are turned off by the control nodes C1, C1b, C2, and C2b, the transistor M5 may turn on later than the transistor M4 due to delay through the gate capacitance thereof and the resistor R1. Further, the transistor M6 may turn on later than the transistor M5 due to delay through gate capacitance of thereof and the resistor R2. When the transistors are turned on in sequence, an amount of current flowing through the differential driver 100 is gradually increased, lowering an output slew rate. A resultant waveform 20 shown in FIG. 2 has a smaller slope than the waveform 10, so a slew rate of the output signal OUT of the differential driver 100 is lowered, decreasing an effect of EMI and reducing noise of the output signal OUT.

During operation of the differential driver 100, parasitic capacitances and resistances are inevitably generated. The parasitic capacitances and resistances generated in the differential driver 100 may not be a concern at low operating frequencies, but may cause problems when the differential driver 100 is operating at high frequencies due to RC resonance. Such RC resonance arising from the parasitic capacitances and resistances may vary turn on times of the transistors M5 and M6, thus varying the slew rate of the output signal OUT. Thus, there is a limit on the maximum operating frequency.

Further variability in the slew rate may arise from the resistors used. A resistor is usually accompanied by an error rate variable due to its manufacturing process. For example, a negative resistor of 1 k$\Omega$ may have an error rate of ±20%. The resistance of the resistor may vary within the range of its error rate in accordance with variations of PVT. If the resistors R1 and R2 for delaying turn on of the transistors M5 and M6 vary in resistance due to PVT, the transistors M5 and M6 may operate with delays different from normal delays as preliminarily designed.

In FIG. 2, a dotted waveform A illustrates deviation of the slew rate of the output signal affected by the aforementioned problems from the waveform 10 and a dotted waveform B illustrates deviation of the slew rate of the output signal affected by the aforementioned problems from the waveform 20. As a result, the differential driver 100 may provide a variable and/or undesired slew rate of the output signal.

SUMMARY OF THE INVENTION

Embodiments of the present invention are therefore directed to a differential driver and method, which substantially overcome one or more of the problems due to the limitations and disadvantages of the related art.

It is therefore a feature of an embodiment of the present invention to provide a differential driver and method capable of adjusting a slew rate without limiting a maximum operating frequency.

It is therefore another feature of an embodiment of the present invention to provide a differential driver and method capable of adjusting a slew rate without being affected by PVT variation.

At least one of the above and other features and advantages of the present invention may be realized by providing a differential driver, including a first pull-up resistor connected a first output terminal, a second pull-up resistor connected a second output terminal, a plurality of differential-input transistor pairs connected to each of the first and second output terminals, current sources connected to each of the differential-input transistor pairs, and a slew rate controller adapted to generate differential input signals to be applied to each of the differential-input transistor pairs in response to an input signal, the slew rate controller being adapted to selectively output the differential input signals simultaneously or sequentially.

The differential-input transistor pairs may operate in a differential mode. The differential-input transistor pairs may be adapted to adjust currents flowing through the pull-up resistors in response to the differential input signals output by the slew rate controller.

The slew rate controller may include a plurality of delay circuits, each delay circuit corresponding to one of the differential-input transistor pairs. The delay circuits may output the differential input signals to corresponding differential-input transistor pairs.

At least one of the delay circuits may be adapted to delay the input signal by a first delay time during a slew-rate non-adjusting period, and delay the input signal by a second delay time during a slew-rate adjusting period, the second delay time being longer than the first delay time. The second delay times of the delay circuits may be different from each other. Differences between adjacent delay times of the second delay times are equal. The first delay times of all of the delay circuits are equal.

The current sources may output equal currents. Each gate width of the differential-input transistors may be determined by the number of the current sources. The gate widths of the differential-input transistors may be equal. The plurality may be three. The current sources may all be independent.

At least one of the above and other features and advantages of the present invention may be realized by providing a method of generating differential output signals, including connecting current sources to a plurality of differential-input transistor pairs connected to each of first and second output terminals, generating differential input signals in response to an input signal, supplying the differential input signals to the plurality of differential-input transistor pairs simultaneously or sequentially, supplying outputs of the plurality of differential-input transistor pairs to the first and second output terminals through respective first and second pull-up resistors.

The differential-input transistor pairs may be operated in a differential mode. Currents flowing through the pull-up resistors in response to the differential input signals using the differential-input transistor pairs may be adjusted.

At least one of the delays used for sequentially supplying the differential input signals to the plurality of differential-input transistor pairs may be longer than delays used for simultaneously supplying the differential input signals. Delays used for sequentially supplying the differential input signals to the plurality of differential-input transistor pairs may be different from one another. Differences between adjacent delay times are equal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
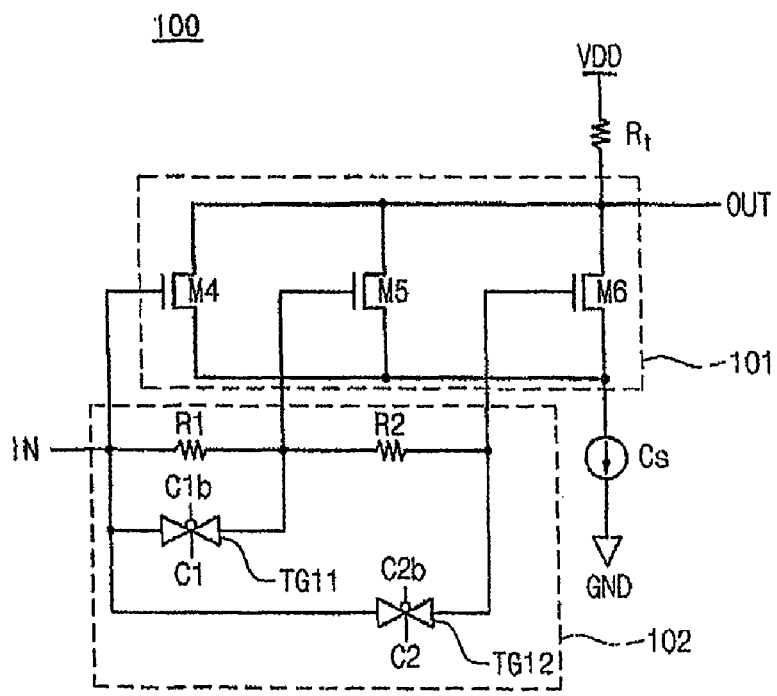
FIG. 1 illustrates a circuit diagram of a general differential driver.
Figure 2:
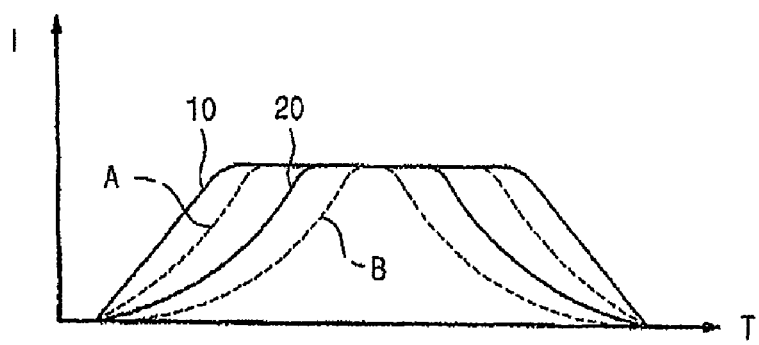
FIG. 2 illustrates slew rates of an output signal from the differential driver of FIG. 1.

Korean Patent Application No. 2006-73456 filed on Aug. 3, 2006, in the Korean Intellectual Property Office, and entitled: "Differential Driver Capable of Controlling Slew Rate," is incorporated by reference herein in its entirety.

Example embodiments of the present invention will now be described more fully hereinafter with reference to the accompanying drawings. The invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

When an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. Further, the term "equal" is to include substantially equal, while "exactly equal" is to mean identical.

In embodiments of the present invention, a differential driver may include pull-up resistors connected each to first and second output terminals, pluralities of differential-input transistor pairs connected each to the first and second output terminals, current sources connected each to the differential-input transistor pairs, and a slew rate controller generating differential input signals to be applied each to the differential-input transistor pairs in response to an input signal. The slew rate controller may generate the differential input signals to set the same delay time or other delay times different from each other. Thus, the differential driver according to embodiments may control a slew rate of its output signal without being affected by the maximum operating frequency and PVT variation.

Figure 3:
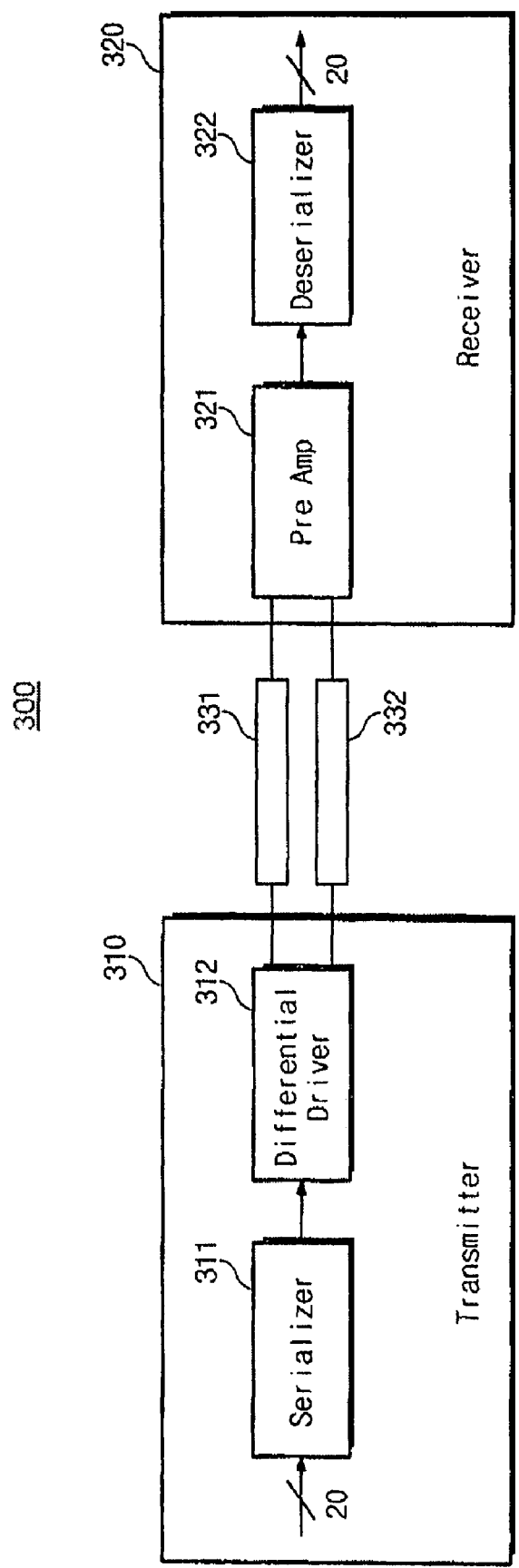
FIG. 3 illustrates a block diagram of a transceiver according to a preferred embodiment by the present invention.

FIG. 3 illustrates a block diagram of a transceiver 300 according to an example embodiment. Referring to FIG. 3, the transceiver 300 may include a transmitter 310, transmission liens 331 and 332, and a receiver 320. The transmitter 310 may include a serializer 311 and a differential driver 312. The receiver 320 may include a pre-amplifier 321 and a deserializer 322.

The serializer 311 of the transmitter 310 may accept n-bit, e.g., 20-bit, parallel data in sync with a low frequency clock signal and may convert the n-bit parallel data into 1-bit serial data that is synchronized with a clock signal having a frequency n times higher than the low-frequency clock signal. The differential driver 312 may receive the 1-bit serial data from the serializer 311 and may transfer the 1-bit serial data to the receiver 320 through transmission lines 331 and 332. The differential driver 312 may serve as a kind of buffer. The differential driver 312 may lower a slew rate and reduce an EMI effect by buffering the 1-bit serial data input thereto.

The pre-amplifier 321 of the receiver 320 may receive serial data from the transmission lines 331 and 332, and may convert the input serial data into a logic signal formatted for the deserializer 322. The deserializer 322 may convert the logic signal into the n-bit parallel data synchronized with the low-frequency clock signal.

Figure 4:
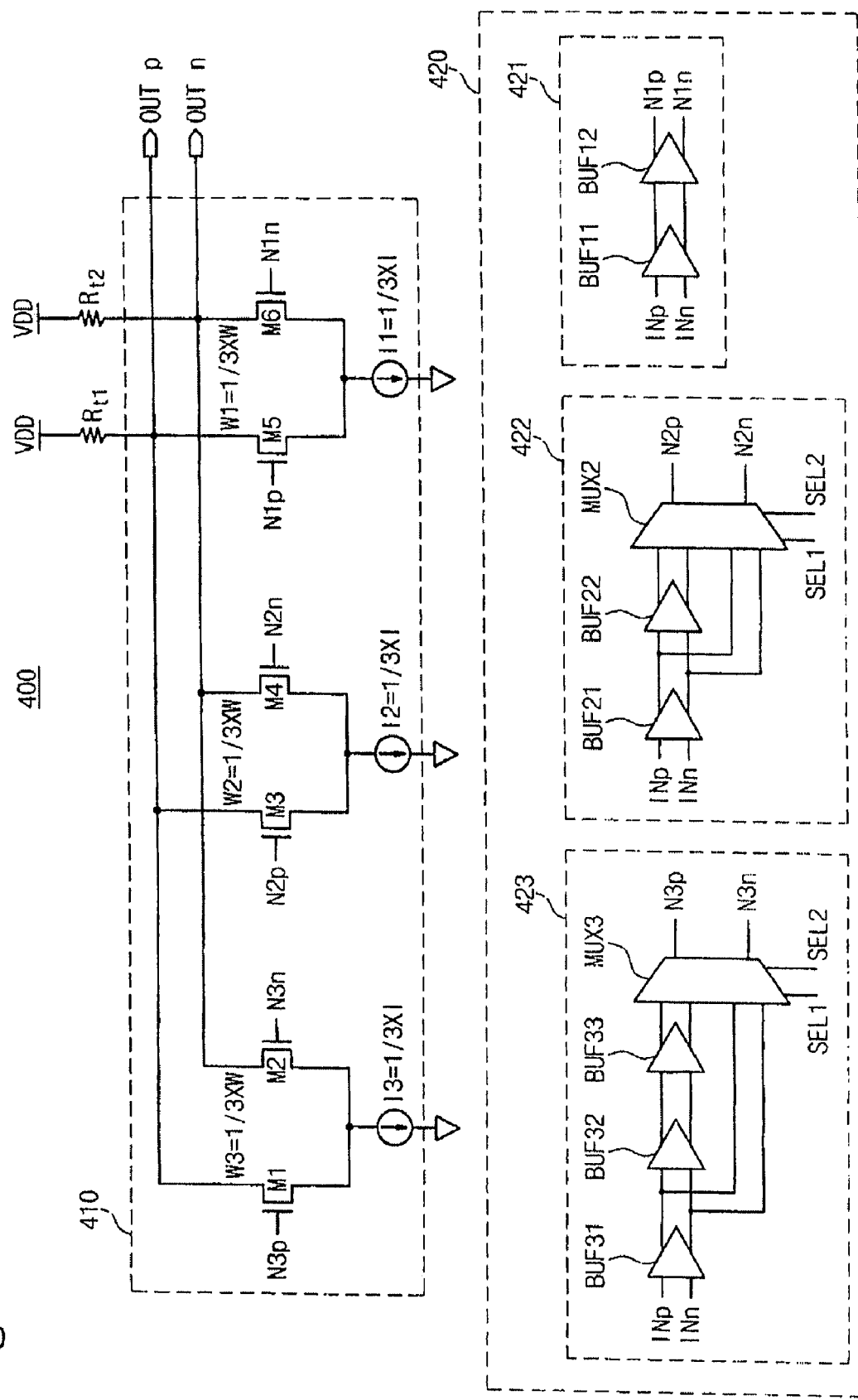
FIG. 4 illustrates a circuit diagram of the differential driver shown in FIG. 3.

FIG. 4 illustrates a circuit diagram of an example embodiment of a differential driver 400 that may be used as the differential driver 312 shown in FIG. 3. Referring to FIG. 4, the differential driver 400 may include terminal resistors Rt1 and Rt2, a main driver circuit 410, and a slew rate controller 420.

The main driver circuit 410 may include six NMOS transistors (hereinafter, referred to as 'transistors') M1~M6 and three current sources I1~I3 having equal currents. The transistors M1 and M2, the transistors M3 and M4, and the transistors M5 and M6 of the main driver circuit 410 may each be referred to as differential-input transistor pairs.

The slew rate controller 420 may include a first delay circuit 421, a second delay circuit 422, and a third delay circuit 423.

The first delay circuit 421 may include buffers BUF11 and BUF12. The second delay circuit 422 may include buffers BUF21 and BUF22, and a multiplexer MUX2. The third delay circuit 423 may include buffers BUF31, BUF32, and BUF33, and a multiplexer MUX3. The delay circuits 421~423 may generate signals N1p~N3p and N1n~N3n to control the transistors relative to each other, i.e., the signals N1p~N3p and N1n~N3n may control the transistors M1~M6, i.e., may turn them on or off. In controlling on and off-operations of the transistors M1~M6 of the main driver circuit 410, the signals N1p~N3p and N1n~N3n generated from the delay circuit 412~423 may serve as differential input signals.

Sources of the transistors M1 and M2 may be commonly connected to a ground through the current source I3. Gates of the transistors M1 and M2 may be respectively connected to two output nodes of the multiplexer MUX3 of the third delay circuit 423. Sources of the transistors M3 and M4 may be commonly connected to the ground through the current source I2. Gates of the transistors M3 and M4 may be respectively connected to two output nodes of the multiplexer MUX2 of the second delay circuit 422 in correspondence therewith. Sources of the transistors M5 and M6 may be commonly connected to the ground through the current source I1. Gates of the transistors M5 and M6 may be respectively connected to two output nodes of a buffer BUF11 of the first delay circuit 421.

Drains of the transistors M1, M3, and M5 may be commonly connected to an output terminal OUTp and a power source node VDD through the terminal resistor Rt1. Drains of the transistors M2, M4, and M6 may be commonly connected to an output terminal OUTn and a power source node VDD through the terminal resistor Rt2.

The current source I1 may be commonly connected to the sources of the transistors M1 and M2, the current source I2 may be commonly connected to the sources of the transistors M3 and M4, and the current source I3 may be commonly connected to the sources of the transistors M5 and M6. Each current source may supply a ⅓ portion of the total amount of current. Thus, each gate width of the transistors M1~M6 may equal W (the whole gate width)×(⅓). The transistors M1 and M2, the transistors M3 and M4, and the transistors M5 and M6 of the main driver circuit 410 may be turned on with the same or different delays relative to one another in accordance with outputs of the slew rate controller 420. Thus, the differential driver 400 may adjust a slew rate of its output signal.

Figure 6:
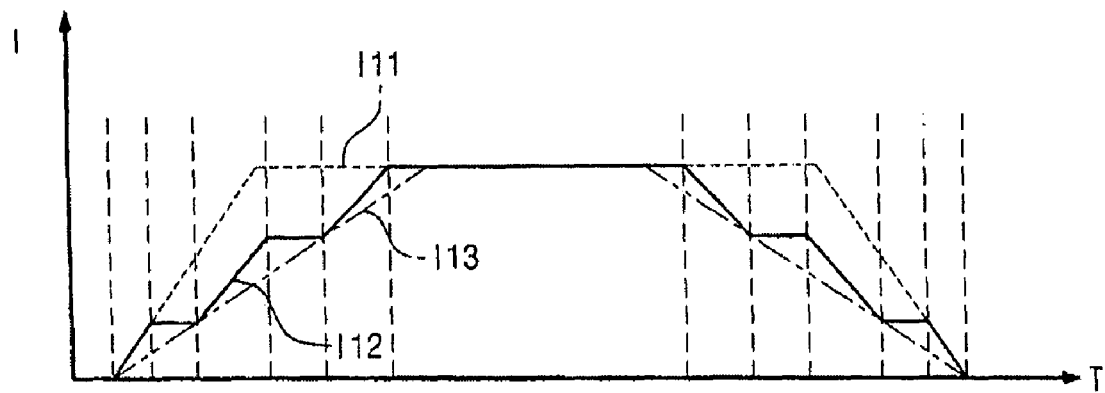
FIG. 6 illustrates a graphic diagram showing a slew rate of an output signal from the differential driver of FIG. 4.
Figure 5:
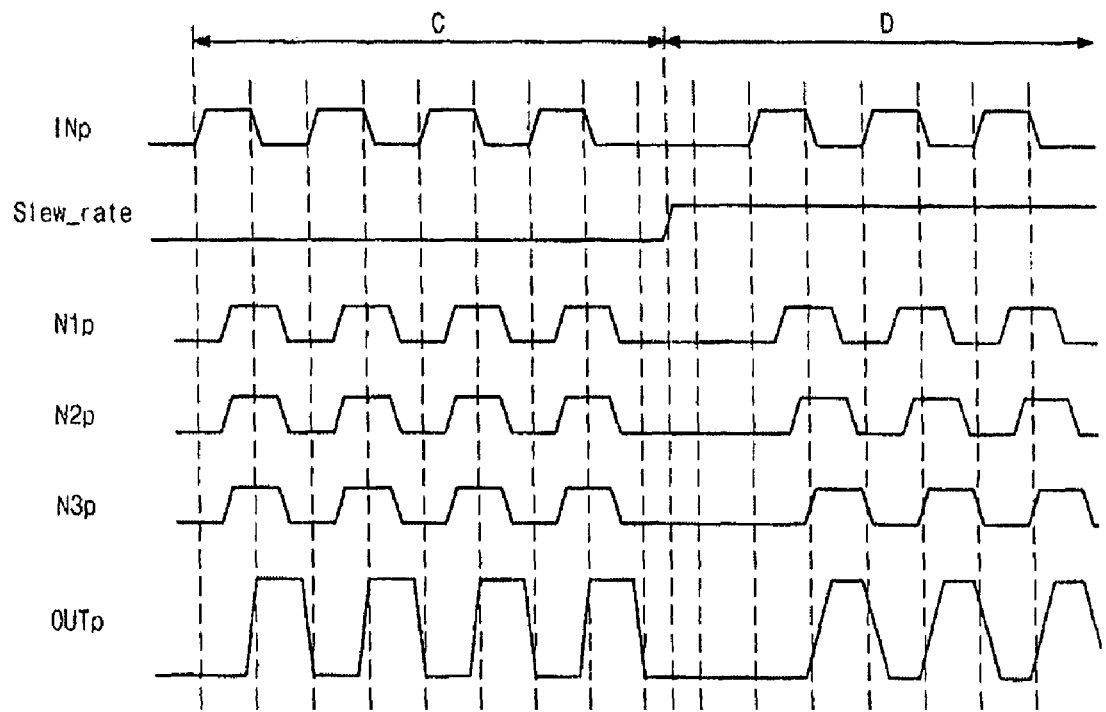
FIG. 5 illustrates a timing diagram showing an operation of the differential driver of FIG. 4.

FIG. 5 illustrates a timing diagram of an operation of the differential driver of FIG. 4, and FIG. 6 illustrates a slew rate of an output signal from the differential driver of FIG. 4. Operation of the differential driver will be described with reference to FIGS. 4, 5, and 6, in which selection signals SEL1 and SEL2 having opposite phases (when SEL1 is low, SEL2 is high, and vice versa) may be used as delay control signals.

The timing diagram shown in FIG. 5 only depicts an input signal INp, the gate input signals N1p, N2p, and N3p, and the output signal OUTp for convenience of description. The remaining signals INn, N1n, N2n, N3n, and OUTn may be substantially the same as those shown in FIG. 5 in operating pattern, but opposite in phase. In other words, the input signals INn and INp are to operate the transistors M1, M3, and M5 and the transistors M2, M4, and M6 in differential modes, i.e., when the input signal INp is high, the input signal INn is low.

The third delay circuit 423 of the slew rate controller 420 may receive the input signals INn and INp through the buffer BUF31. Outputs of the buffer BUF31 may be supplied to the multiplexer MUX3 directly and through the buffers BUF32 and BUF33. The multiplexer MUX3 of the third delay circuit 423 may selectively transfer the input signals INn and INp having passed through the buffers BUF32 and BUF33 or directly output from the buffer BUF31 to gates of the transistors M1 and M2 of the main driver circuit 410 in accordance with the selection signals SEL1 and SEL2. For example, if the selection signal SEL1 is high and the selection signal SEL2 is low, the multiplexer MUX3 of the third delay circuit 423 may select and output the input signals INn and INp having passed through the buffers BUF32 and BUF33. If the selection signals SEL1 is low and the selection signal SEL2 is high, the multiplexer MUX3 of the third delay circuit 423 may select and output the input signals INn and INp directly from the buffer BUF31. The output signal N3p of the multiplexer MUX3, corresponding to the input signal INp, may be applied to the gate of the transistor M1. The output signal N3n of the multiplexer MUX3, corresponding to the input signal INn, may be applied to the gate of the transistor M2.

The second delay circuit 422 of the slew rate controller 420 may receive the input signals INn and INp through the buffer BUF21. Outputs of the buffer BUF21 may be supplied to the multiplexer MUX2 directly and through the buffer BUF22. The multiplexer MUX2 of the second delay circuit 422 may selectively transfer the input signals INn and INp having passed through the buffer BUF22 or directly from the buffer BUF21 in accordance with the selection signals SEL1 and SEL2 to gates of the transistors M3 and M4 of the main driver circuit 410. For example, if the selection signals SEL1 is high and the selection signal SEL2 is low, the multiplexer MUX2 of the second delay circuit 422 may select and output the input signals INn and INp having passed through the buffers BUF32 and BUF33. If the selection signals SEL1 is low and the selection signal SEL2 is high, the multiplexer MUX2 of the second delay circuit 422 may select and output the input signals INn and INp directly from the buffer BUF22. The output signal N2p of the multiplexer MUX3, corresponding to the input signal INp, may be applied to the gate of the transistor M3. The output signal N2n of the multiplexer MUX2, corresponding to the input signal INn, may be applied to the gate of the transistor M4.

The first delay circuit 421 of the slew rate controller 420 may receive the input signals INn and INp through the buffers BUF11 and BUF12. Outputs of the buffer BUF12 may be applied each to gates of the transistors M5 and M6 of the main driver circuit 410. The output signal N1p of the first delay circuit 421, corresponding to the input signal INp, may be applied to the gate of the transistor M5. The output signal N1n of the first delay circuit 421, corresponding to the input signal INn, may be applied to the gate of the transistor M6.

The first delay circuit 421 may directly output the input signals INn and INp, i.e., without selection by a multiplexer, different from the second and third delay circuits 422 and 423 that alternatively select signals passing through different buffers in accordance with the selection signals SEL1 and SEL2. Thus, the first delay circuit 421 may not include a multiplexer, as do the second and third delay circuits 422 and 423. Therefore, the first delay circuit 421 may include the buffer BUF12 in order to provide a delay effect similar to that of the second and third delay circuits 422 and 423 using a multiplexer. Since the first delay circuit 421 includes the buffer BUF12 instead of a multiplexer, the output signals N1p and N1n may be generated having the same delay as those output from the second and third delay circuits 422 and 423.

In the slew rate controller 420, when the multiplexer MUX3 of the third delay circuit 423 transfers the input signals INn and INp directly from the buffer BUF31, the multiplexer MUX2 of the second delay circuit 422 may transfer the input signals INn and INp directly from the buffer BUF21, and the first delay circuit 421 may transfer the input signals INn and INp from the buffer BUF12. Thus, the first, second, and third delay circuits, 421, 422, and 423, may output the output signals N1p~N3p and N1n~N3n having the same delay. In other words, the slew rate controller 420 may delay the input signals INn and INp by a first delay time (the minimum delay time) during a slew-rate nonadjusting period.

Therefore, the transistors M1~M6 may be simultaneously turned on by the output signals of the first through third delay circuits 421~423. If the transistors M1~M6 are simultaneously turned on, a high current may abruptly flow through the differential driver 400, increasing slew rates of the output signals OUTn and OUTp.

In a period C of the timing diagram shown in FIG. 5, when the selection signals SEL1 and SEL2 of the period C are set to select the input signals INn and INp without passing through all of the buffer(s) in the second and third delay circuits 422 and 423, the first through third delay circuits 421~423 may output the signals N3p, N2p, and N1p at the same time. Thus, as shown in FIG. 5, the gate input signals N3p, N2p, and N1p of the transistors M1, M3, and M5 of the main driver circuit 410, corresponding to the input signal INp, may be supplied simultaneously. The transistors M1, M3, and M5 may be simultaneously turned on in response to the gate input signals N3p, N2p, and N1p. Thus, a large current may suddenly flow through the differential driver 400, increasing a slew rate of the output signal OUTp thereof as shown in FIG. 5.

In a period D of the timing diagram shown in FIG. 5, when the selection signals SEL1 and SEL2 of the period D are set to select the input signals INn and INp having passed through all of the buffer(s) in the second and third delay circuits 422 and 423, the first through third delay circuits 421~423 may output the signals N3p, N2p, and N1p at different times.

When the multiplexer MUX3 of the third delay circuit 423 in the slew rate controller 420 outputs the input signals INn and INp that have passed through the buffers BUF32 and BUF33, the multiplexer MUX2 of the second delay circuit 422 outputs the input signals INn and INp that have passed through the buffer BUF22, and the first delay circuit 421 output the input signals INn and INp through the buffer BUF12, the first through third delay circuits 421~423 outputs the signals N3p, N2p, and N1p with different delays. This means that the input signals INn and INp are delayed by a second delay time longer than the first delay time (the minimum delay time) during a slew-rate adjusting period. The delay circuits 421~423 may output the output signals N3p, N2p, and N1p sequentially.

The third delay circuit 423 may output the input signals INn and INp having passed through the buffers BUF31, BUF32 and BUF33. The second delay circuit 422 may output the input signals INn and INp having passed through the buffers BUF21 and BUF22. The first delay circuit 421 may output the input signals INn and INp having passed through the buffers BUF11 and BUF12. Hence, the output signals N2n and N2p of the second delay circuit 422 may be output after the output signals N1p and N1n of the first delay circuit 421 are output. The output signals N3n and N3p of the third delay circuit 423 may be output after the output signals N2p and N2n of the second delay circuit 422 are output.

The transistors M1~M6 of the main driver circuit 410, which are controlled by the output signals N1n~N3n and N1p~N3p of the first through third delay circuits 421~423, may be turned on at different times due to the differences between when the output signals N1p and N1n of the first delay circuit 421, the outputs signals N2p and N2n of the second delay circuit 422, and the output signals N3p and N3n of the third delay circuit 423 are supplied. For example, when the output signals N2p and N2n of the second delay circuit 422 are output after the output signals N1p and N1n of the first delay circuit 421, and the output signals N3p and N3n of the third delay circuit 423 are output after the output signals N2p and N2n of the second delay circuit 422, then the transistors may be turned on in the following order: the transistors M5 and M6; the transistors M3 and M4; and finally the transistors M1 and M2. As an amount of current flowing through the differential driver 400 becomes incrementally larger, slew rates of the output signals OUTp and OUTn may increase.

Although not shown in FIG. 5, the same waveform may result for a slew rate of the output signal OUTn responding to the gate input signals N1n, N2n, and N3n of the transistors M2, M4, and M6 corresponding to the input signal INn. A waveform of the output signal OUTp is equal and opposite that shown for the output signal OUTn.

The waveforms of FIG. 6 illustrate a current at the output terminal of the main driver circuit 410 versus time. The output signal OUTn waveform is same as that of the output signal OUTp in FIG. 6.

An output waveform I11 in FIG. 6 illustrates a high current abruptly flowing through the differential driver 400 due to the simultaneous turn-on of the transistors M1, M3, and M5. As can be seen therein, a slope of the output waveform I11 is large, indicating a high slew rate.

An output waveform I12 in FIG. 6 illustrates the output when the differential driver 400 is operating in the slew-rate adjusting mode. In this mode, the transistor M5 may be first turned on by the slew rate controller 420 and a current amount of the output signal increases up to ⅓ of the total current amount I. Then, the transistor M3 is turned on by the slew rate controller 420 after a predetermined delay time, and the current amount increases up to ⅔ I from ⅓ I. Finally, the transistor M5 is turned, and the current amount increases up to I from ⅔ I. The output waveform I12 substantially agrees with an output waveform I13, i.e., the desired output waveform, and has a smaller slope than that of the output waveform I11. Therefore, if the transistors M1, M3, and M5 of the main driver circuit 410 are turned on sequentially, a slew rate of the output signal of the differential driver 400 may decrease, as illustrated in FIG. 6.

The slew rate controller 420 including the first through third delay circuits 421~423 may provide independent delay times to the input signals INn and INp, and may apply the delayed signals N1n~N3n and N1p~N3p to the gates of the transistors M1~M6 of the main driver circuit 410 in accordance with respective delay times. Thus, slew rates of the signals output from the differential driver 400 may be controlled by controlling turn-on times of the transistors M1~M6 connected independently by pairs to the current sources I1~I3 by controlling when the signals N1n~N3n and N1p~N3p are supplied to the gates of the transistors M1~M6.

When the main driver circuit 410 includes the current source I1 commonly connected to sources of a pair of transistors M1 and M2, the current source I2 commonly connected to source of a pair transistors M3 and M4, and the current source I3 commonly connected to sources of a pair of transistors M5 and M6, each current source may provide a ⅓ portion of the total current amount. Thus, each gate width of the transistors M1~M6 may be ⅓ W (the whole gate width).

Under this condition, parasitic capacitances and resistances internally generated in the differential driver 400 may be less than that of the conventional differential driver 100 by about ⅓. Thus, in the differential driver 400, delay times for operating the transistors M1~M6 may not vary greatly due to RC resonance arising from the parasitic capacitance and resistance as the operating frequency increases. As the delay times for operating the transistors M1~M6 do not vary greatly, a slew rate of the output signal may approximate a desired result. Namely, a slew rate of the differential driver 400 may vary less than that of the general differential driver 100. As a result, maximum operating frequencies that may be used with the differential driver 400 may be less limited than those of the general differential driver 100.

The slew rate controller 420 of the differential driver 400 includes the first through third delay circuits 421~423 in order to grant different delay times thereto. The delay circuits 421~423 includes plural buffers directly using the resistors for delay. As the current sources I1~I3 are independent, the maximum value of the currents flowing through the transistors may be fixed and the operating conditions of the transistors may be stabilized.

Therefore, even when PVT varies, the differential driver 400 may stably generate delay times for operating the transistors M1~M6. Since the delay times for operating the transistors M1~M6 are variable over a few ranges, a slew rate of the output signal may more closely approximate a desired result. Thus, the differential driver 400 may be more robust to PVT variation than the general differential driver 100.

As a result, the differential driver 400 of the present invention may adjust a slew rate of the output signal without being affected by the maximum operating frequency and PVT variation. Additional current sources, transistors and delay circuits may be included to even more closely approximate a desired result. Further, the delays of the delay circuits may not be equally spaced, i.e., a difference between a first and second delay may be different than a difference between a second and third delay.

It will also be understood that, although the terms "first" and "second" etc. may be used herein to describe various elements, structures, components, regions, layers and/or sections, these elements, structures, components, regions, layers and/or sections should not be limited by these terms. These terms are only used to distinguish one element, structure, component, region, layer and/or section from another element, structure, component, region, layer and/or section. Thus, a first element, structure, component, region, layer or section discussed below could be termed a second element, structure, component, region, layer or section without departing from the teachings of exemplary embodiments.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "include" and/or "including," when used in the body of this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A differential driver, comprising:
    a first pull-up resistor connected a first output terminal;
    a second pull-up resistor connected a second output terminal;
    a plurality of differential-input transistor pairs connected to each of the first and second output terminals;
    current sources connected to each of the differential-input transistor pairs; and
    a slew rate controller configured to generate differential input signals to be applied to each of the differential-input transistor pairs in response to an input signal, wherein:
    the slew rate controller includes a plurality of delay circuits, each delay circuit being configured to receive the input signal and output the differential input signals to the differential-input transistor pairs simultaneously or sequentially,
    the current sources are configured to supply a fixed current to each of the differential-input transistor pairs, and
    at least one of the delay circuits is configured to delay the input signal by a first delay time during a slew-rate non-adjusting period, and delay the input signal by a second delay time during a slew-rate adjusting period, the second delay time being longer than the first delay time.

2. The differential driver as claimed in claim 1, wherein the differential-input transistor pairs operate in a differential mode.

3. The differential driver as claimed in claim 2, wherein the differential-input transistor pairs are configured to adjust currents flowing through the pull-up resistors in response to the differential input signals output by the slew rate controller.

4. The differential driver as claimed in claim 1, wherein the delay circuits output the differential input signals to corresponding differential-input transistor pairs.

5. The differential driver as claimed in claim 1, wherein the second delay times of the delay circuits are different from each other.

6. The differential driver as claimed in claim 5, wherein differences between adjacent delay times of the second delay times are equal.

7. The differential driver as claimed in claim 1, wherein the first delay times of all of the delay circuits are equal.

8. The differential driver as claimed in claim 1, wherein the current sources output equal currents.

9. The differential driver as claimed in claim 1, wherein each gate width of the differential-input transistors is determined by whole gate widths of differential-input transistors and the number of the current sources.

10. The differential driver as claimed in claim 1, wherein gate widths of the differential-input transistors are equal.

11. The differential driver as claimed in claim 1, wherein the plurality of differential input transistor pairs is three.

12. The differential driver as claimed in claim 1, wherein the current sources are all independent.

13. A method of generating differential output signals, the method comprising:
    providing respective fixed currents from respective current sources to a plurality of differential-input transistor pairs connected to each of first and second output terminals;
    generating differential input signals in response to an input signal;

supplying the differential input signals to the plurality of differential-input transistor pairs simultaneously or sequentially;

supplying outputs of the plurality of differential-input transistor pairs to the first and second output terminals, the first and second output terminals being connected to respective first and second pull-up resistors, wherein:

delays used for sequentially supplying the differential input signals to the plurality of differential-input transistor pairs are different from one another, and at least one of the delays used fro sequentially supplying the differential input signals to the plurality of differential-input transistor pairs is longer than delays used for simultaneously supplying the differential input signals.

14. The method as claimed in claim 13, further comprising operating the differential-input transistor pairs in a differential mode.

15. The method as claimed in claim 14, further comprising adjusting currents flowing through the pull-up resistors in response to the differential input signals using the differential-input transistor pairs.

16. The method as claimed in claim 13, wherein differences between adjacent delay times are equal.

17. A differential driver, comprising:

a first pull-up resistor connected to a first output terminal;

a second pull-up resistor connected to a second output terminal;

a plurality of differential-input transistor pairs connected to each of the first and second output terminals;

current sources connected to each of the differential-input transistor pairs, the current sources being configured to supply a fixed current to each of the differential-input transistor pairs; and a plurality of delay circuits, each delay circuit receiving an input signal and generating differential input signals to be applied to each of the differential-input transistor pairs in response to the input signal, wherein at least one of the delay circuits is configured to delay the input signal by a first delay time during a slew-rate non-adjusting period, and to delay the input signal by a second delay time during a slew-rate adjusting period, the second delay time being longer than the first delay time.

* * * * *